United States Patent
Sakamoto et al.

(10) Patent No.: US 11,575,296 B2
(45) Date of Patent: Feb. 7, 2023

(54) HEAT MANAGEMENT SYSTEM FOR ELECTRIC VEHICLE

(71) Applicants: TOYOTA JIDOSHA KABUSHIKI KAISHA, Toyota (JP); SUBARU CORPORATION, Tokyo (JP)

(72) Inventors: Hironobu Sakamoto, Okazaki (JP); Yoshihiro Ishihara, Shibuya-ku (JP)

(73) Assignees: TOYOTA JIDOSHA KABUSHIKI KAISHA, Toyota (JP); SUBARU CORPORATION, Tokyo (JP)

( * ) Notice: Subject to any disclaimer, the term of this patent is extended or adjusted under 35 U.S.C. 154(b) by 206 days.

(21) Appl. No.: 17/178,007

(22) Filed: Feb. 17, 2021

(65) Prior Publication Data
US 2021/0296964 A1  Sep. 23, 2021

(30) Foreign Application Priority Data
Mar. 19, 2020  (JP) .............................. JP2020-050189

(51) Int. Cl.
  *H02K 9/19* (2006.01)
  *B60K 11/04* (2006.01)
  *H05K 7/20* (2006.01)

(52) U.S. Cl.
  CPC ............. *H02K 9/19* (2013.01); *B60K 11/04* (2013.01); *H05K 7/20872* (2013.01); *H05K 7/20927* (2013.01)

(58) Field of Classification Search
  CPC . H02K 9/19; B60K 1/00; B60K 11/04; B60K 11/02; B60K 2001/003; B60K 2001/005; B60K 2001/006; B60K 2001/008; H05K 7/20872; H05K 7/20927; B60H 1/00278; B60H 1/00392; B60H 1/32284; B60H 1/00899; B60H 1/00385; B60H 1/004; B60H 1/00885; B60H 2001/3288; B60L 58/26; B60L 58/27; H01M 10/615; H01M 10/625;
  (Continued)

(56) References Cited

U.S. PATENT DOCUMENTS

2013/0175022 A1* 7/2013 King .................. B60L 50/62
                                                237/12.3 B
2016/0107508 A1* 4/2016 Johnston ............ B60H 1/00278
                                                237/12.3 A
(Continued)

FOREIGN PATENT DOCUMENTS

JP     2019-119369 A     7/2019
JP     2019-213337 A    12/2019

*Primary Examiner* — Grant Moubry
*Assistant Examiner* — James G Moubry
(74) *Attorney, Agent, or Firm* — Oliff PLC

(57) ABSTRACT

A heat management system disclosed herein is used for an electric vehicle. The heat management system may comprise an oil cooler, an oil pump, a converter cooler, a first heat exchanger, a second heat exchanger, a first channel, a second channel, a channel valve, a bypass channel, and a controller. While executing the heat pump mode, the controller may be configured to periodically execute an operation of: switching the channel valve from the second valve position to the first valve position and activating the oil pump; and returning the channel valve from the first valve position to the second valve position and inactivating the oil pump in response to a predetermined time having passed.

5 Claims, 5 Drawing Sheets

(58) Field of Classification Search
CPC ............. H01M 10/633; H01M 10/635; H01M 10/6568; Y02E 60/10; Y02T 10/70
See application file for complete search history.

(56) References Cited

U.S. PATENT DOCUMENTS

| | | | |
|---|---|---|---|
| 2016/0153343 A1* | 6/2016 | Kakehashi | B60H 1/3228 123/41.31 |
| 2016/0221417 A1* | 8/2016 | Ito | B60H 1/2218 |
| 2018/0236842 A1* | 8/2018 | Allgaeuer | B60H 1/00278 |
| 2019/0061470 A1* | 2/2019 | Koberstein | B60H 1/00392 |
| 2019/0176563 A1* | 6/2019 | Kim | B60H 1/323 |
| 2019/0299791 A1* | 10/2019 | Gonze | B60L 1/003 |

\* cited by examiner the oil cooler, the converter cooler, and the first heat exchanger to each other will be termed a first channel.

The second channel extends through the second heat exchanger and is connected to an inlet and an outlet of the first heat exchanger. The first channel is also connected to the inlet and the outlet of the first heat exchanger. The first heat exchanger is shared between a circulating system of the first channel and a circulating system of the second channel. The channel valve is configured to select a first valve position and a second valve position. At the first valve position, the channel valve allows a flow of the first heat medium from the first channel to the first heat exchanger and cuts off the flow of the first heat medium from the second channel to the first heat exchanger. At the second valve position, the channel valve allows the flow of the first heat medium from the second channel to the first heat exchanger and cuts off the flow of the first heat medium from the first channel to the first heat exchanger.

While the first valve position is selected, the first heat medium that has passed through the oil cooler and the converter cooler can exchange the heat with the outside air in the first heat exchanger, but the first heat medium that has passed through the second heat exchanger cannot exchange the heat with the outside air. While the second valve position is selected, the first heat medium that has passed through the second heat exchanger can exchange the heat with the outside air in the first heat exchanger, but the first heat medium that has passed through the oil cooler and the converter cooler cannot exchange the heat with the outside air.

When the temperature of the first heat medium rises due to a temperature rise in the power converter, the channel valve selects the first valve position, by which the heat of the power converter is released in the first heat exchanger. When the temperature of the first heat medium rises due to a temperature rise in the motor (oil), the channel valve also selects the first valve position, by which the heat of the motor (oil) is released in the first heat exchanger. The motor and the first heat medium exchange heat via the oil. A timing when the temperature of the first heat medium rises due to the temperature rise in the power converter differs from a timing when the temperature of the first heat medium rises due to the temperature rise in the motor. If the first valve position is frequently selected in response to the temperature rise in the power converter and the temperature rise in the motor, this makes the first heat medium less frequently circulate between the second heat exchanger and the first heat exchanger. The technology disclosed herein solves this problem. In particular, the disclosure herein provides a technology that does not reduce the frequency of first heat medium circulating between a second heat exchanger and a first heat exchanger while a heat pump mode in which the heat of outside air is transferred to second heat medium via the first heat medium is executed.

HEAT MANAGEMENT SYSTEM FOR ELECTRIC VEHICLE

CROSS-REFERENCE TO RELATED APPLICATION

This application claims priority to Japanese Patent Application No. 2020-050189 filed on Mar. 19, 2020, the contents of which are hereby incorporated by reference into the present application.

TECHNICAL FIELD

The technology disclosed herein relates to a heat management system for an electric vehicle. The "electric vehicle" herein includes a hybrid vehicle and a fuel-cell vehicle.

BACKGROUND

A cruising range of an electric vehicle can be increased by suitably utilizing heat of its traction motor and heat of outside air to reduce power consumption of an electric device used for temperature regulation. Japanese Patent Application Publication Nos. 2019-213337 and 2019-119369 each propose a heat management system for an electric vehicle that comprehensively manages heat of outside air and heat of a motor, an inverter, and a battery to suitably utilize the heat of each portion of the electric vehicle.

The heat management system of Japanese Patent Application Publication No. 2019-213337 includes a first temperature regulation circuit and a second temperature regulation circuit. The first temperature regulation circuit is configured to cool a traction motor and a power converter configured to supply electric power to the motor. The second temperature regulation circuit is configured to regulate the temperature of a cabin. In the first temperature regulation circuit, first heat medium circulates through an oil cooler, a converter cooler, and a radiator. The oil cooler is configured to cool oil for cooling the motor by the first heat medium. In the second temperature regulation circuit, second heat medium circulates between a chiller for air-conditioning in the cabin and an air conditioner outdoor unit. The radiator and the air conditioner outdoor unit are arranged adjacent to each other, thus heat is exchanged also between the first heat medium and the second heat medium.

SUMMARY

In the heat management system of Japanese Patent Application Publication No. 2019-213337, heat can be exchanged between the radiator in the first temperature regulation circuit (temperature regulation circuit for the motor and the power converter) and the air conditioner outdoor unit in the second temperature regulation circuit (temperature regulation circuit for the cabin). The inventors have considered to actively utilize the radiator (which will hereinafter be termed a first heat exchanger) to emit the heat of the motor and the power converter to regulate the temperature of the cabin. That is, they have considered to incorporate a second heat exchanger configured to exchange heat between the first heat medium in the first temperature regulation circuit and the second heat medium in the second temperature regulation circuit, a second channel, and a channel valve into the heat management system. Hereinbelow, a channel that connects A heat management system disclosed herein is used for an electric vehicle. The heat management system may comprise an oil cooler, an oil pump, a converter cooler, a first heat exchanger, a second heat exchanger, a first channel, a second channel, a channel valve, a bypass channel, and a controller.

The oil cooler may be configured to cool oil by first heat medium. The oil is used to cool a traction motor. The oil pump may be configured to circulate the oil between the oil cooler and the traction motor. The converter cooler may be configured to cool a power converter configured to supply electric power to the traction motor by the first heat medium. The first heat exchanger may be configured to exchange heat between the first heat medium and outside air. The second heat exchanger may be configured to exchange heat between second heat medium for an air conditioner of a cabin and the first heat medium. The first channel may extend through the oil cooler and the converter cooler and be connected to an inlet and an outlet of the first heat exchanger. The second channel may extend through the second heat exchanger and be connected to the inlet and the outlet of the first heat exchanger.

The channel valve may be configured to select a first valve position and a second valve position. At the first valve position, the channel valve allows a flow of the first heat medium from the first channel to the first heat exchanger and cuts off the flow of the first heat medium from the second channel to the first heat exchanger. At the second valve position, the channel valve allows the flow of the first heat medium from the second channel to the first heat exchanger and cuts off the flow of the first heat medium from the first channel to the first heat exchanger. The bypass channel may be configured to allow the first heat medium to bypass the first heat exchanger and circulate between the oil cooler and the converter cooler when the second valve position is selected. The controller may be configured to execute a heat pump mode in which the channel valve selects the second valve position, heat is transferred from the outside air to the first heat medium in the first heat exchanger, and heat is transferred from the first heat medium to the second heat medium in the second heat exchanger.

While executing the heat pump mode, the controller may be configured to periodically execute an operation of: switching the channel valve from the second valve position to the first valve position and activating the oil pump; and returning the channel valve from the first valve position to the second valve position and inactivating the oil pump in response to a predetermined time having passed.

In the heat management system disclosed herein, the controller periodically switches the channel valve from the second valve position to the first valve position and activates the oil pump. Thus, the heat of the oil is periodically transferred to the first heat medium, and the heat of the first heat medium is periodically released to the outside air in the first heat exchanger. As a result, both the temperature of the first heat medium and the temperature of the oil decrease. Therefore, the frequency of the first valve position being selected due to a temperature rise in the traction motor before a cycle of the operation passes is reduced. The above-described heat management system can prevent a reduction in the frequency of the first heat medium circulating between the second heat exchanger and the first heat exchanger.

DETAILED DESCRIPTION

Figure 1:
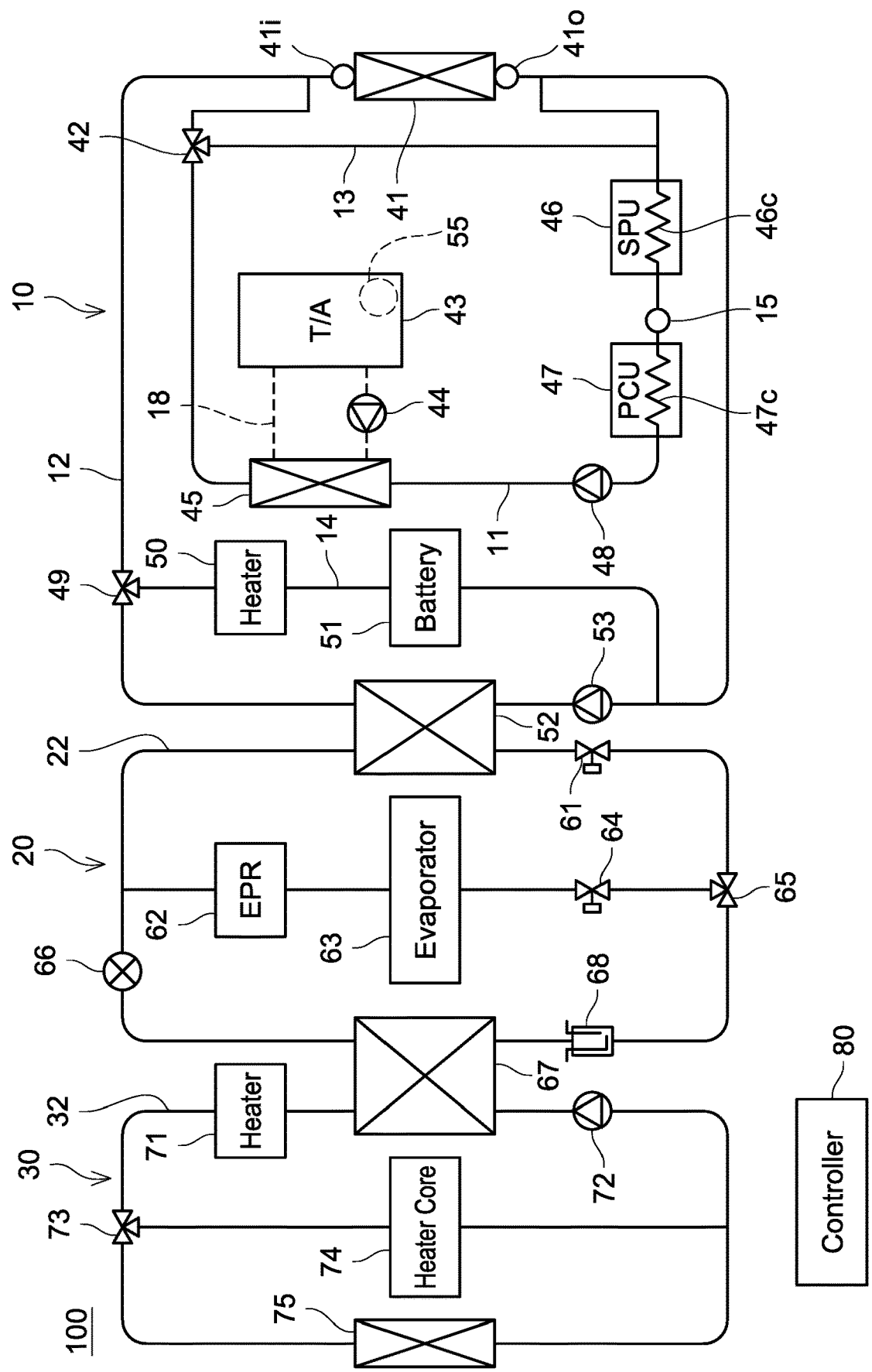
FIG. 1 is a diagram showing a heat management system according to an embodiment.

Some of the features characteristic to the heat management system disclosed herein will be listed. It should be noted that the respective technical elements are independent of one another, and are useful solely or in combinations.

In the heat pump mode, the controller causes the channel valve to select the second valve position to allow the first heat medium in a lower temperature than the temperature of the outside air to flow into the first heat exchanger and allow the second heat medium in a lower temperature than the temperature of the first heat medium that has absorbed the heat from the outside air into the second heat exchanger. In the heat management system disclosed herein, the controller may be configured to activate the oil pump in response to the temperature of the oil becoming higher than the temperature of the first heat medium in the first channel while holding the channel valve at the second valve position during the heat pump mode. An amount of heat generated by the power converter may be larger than an amount of heat generated by the traction motor for a while after the electric vehicle started traveling, for example. In this case, the temperature of the first heat medium is higher than the temperature of the oil. If the oil pump is activated in this state, the first heat medium will heat the oil. By the controller activating the oil pump in response to the temperature of the oil becoming higher than the temperature of the first heat medium in the first channel, the oil is cooled by the first heat medium. When the channel valve selects the first valve position, the oil has already been cooled by the first heat medium. Consequently, when the channel valve selects the second valve position again in response to the predetermined time having passed, the temperature of the oil is low. Therefore, a temperature rise in the oil (motor) can be reduced. Moreover, when frost forms on the first heat exchanger, heat exchange efficiency of the first heat exchanger may thereby be decreased. The first heat medium has already been heated by the heat of the power converter and the motor (oil) at the time when the cycle of the operation has passed. By this first heat medium flowing through the first heat exchanger, the first heat exchanger can be defrosted earlier.

The controller may be configured to switch the channel valve from the second valve position to the first valve position and activate the oil pump regardless of the cycle of the operation, in response to the temperature of the first heat medium in the first channel becoming higher than a predetermined upper limit temperature while holding the channel valve at the second valve position during the heat pump mode. When the temperature of the first heat medium is higher than the predetermined upper limit temperature, the first heat medium cannot cool the power converter or the oil cooler. In this case, the first heat medium and the oil are cooled by the controller switching the channel valve from the second valve position to the first valve position and activating the oil pump.

The controller may be configured to decrease an output of the oil pump gradually before the predetermined time passes and inactivate the oil pump in response to the predetermined time having passed. When the output of the oil pump is high, heat exchange is facilitated between the oil and the first heat medium, as a result of which the temperature of the first heat medium rises sharply. By the controller gradually decreasing the output of the oil pump, the sharp temperature rise in the first heat medium before the cycle of the operation passes can be avoided.

The controller may be configured to inactivate the oil pump in response to the temperature of the oil (oil temperature) becoming lower than a first lower limit temperature while not executing the heat pump mode; and inactivate the oil pump in response to the oil temperature becoming lower than a second lower limit temperature while executing the heat pump mode. The second lower limit temperature may be lower than the first lower limit temperature. In the heat pump mode, it is desirable to prolong, as long as possible, a time period during which the first heat medium is allowed to flow from the second channel to the first heat exchanger. By the lower limit temperature for the oil temperature being set lower in the heat pump mode, a time period required for the temperature of the motor (oil) to reach the upper limit temperature next can be prolonged. Consequently, the time period during which the first heat medium is allowed to flow from the second channel to the first heat exchanger can be prolonged.

(First Embodiment) With reference to the drawings, a heat management system 100 according to a first embodiment will be described. FIG. 1 shows a circuit diagram of the heat management system 100. The heat management system 100 is mounted on an electric vehicle and is configured to regulate the temperatures of a vehicle-mounted device and a cabin. The heat management system 100 regulates the temperatures of a traction motor 55, a battery 51 storing electric power for the motor 55, and a smart power unit (SPU) 46 and a power control unit (PCU) 47 that supply the electric power to the motor 55.

Output of the battery 51 exceeds 200 volts. When outputting large electric power, the battery 51 generates heat. The SPU 46 distributes the electric power of the battery 51 to some devices including the PCU 47. The SPU 46 includes a DC-DC converter and is configured to step down the voltage of electric power of the battery 51 to supply it to auxiliary equipment (vehicle-mounted low-power device). The PCU 47 is configured to convert the DC power of the battery 51 into AC power to supply it to the motor 55. The SPU 46 and the PCU 47 also generate heat while operating. Main sources of the heat generated by the SPU 46 and the PCU 47 are switching elements for power conversion.

The heat management system 100 mainly functions to cool the motor 55, the battery 51, the SPU 46, and the PCU 47, but it functions to warm these devices when the vehicle travels in cold climates.

The heat management system 100 includes a first heat circuit 10, a second heat circuit 20, and a third heat circuit 30. Heat media respectively flow in the first heat circuit 10, the second heat circuit 20, and the third heat circuit 30. Channels in which the heat media flow are independent from each other among the first heat circuit 10, the second heat circuit 20, and the third heat circuit 30. The heat media in the first heat circuit 10, the second heat circuit 20, and the third heat circuit 30 may be constituted of the same material or different materials. Hydrofluorocarbons can be used as the heat media, for example. Herein, the heat medium flowing in the first heat circuit 10 is termed first heat medium, the heat medium flowing in the second heat circuit 20 is termed second heat medium, and the heat medium flowing in the third heat circuit 30 is termed third heat medium.

The first heat circuit 10 regulates the temperature of the vehicle-mounted device. The second heat circuit 20 and the third heat circuit 30 regulate the temperature of the cabin. For cooling the vehicle-mounted device, the first heat circuit 10 releases the heat of the first heat medium to the outside air. When a heater for the cabin is turned on, the first heat circuit 10 may heat the second heat medium by utilizing the heat of the outside air. The disclosure herein focuses on cooling the device while heating the air in the cabin. In the present embodiment, descriptions for temperature rise in the device and cooling of the air in the cabin will not be described.

The first heat circuit 10 includes a first channel 11, a second channel 12, a bypass channel 13, and a battery channel 14. As described above, the first heat circuit 10 cools the SPU 46, the PCU 47, the motor 55, and the battery 51. The motor 55 is cooled by the first heat medium via oil.

The first channel 11 extends through the SPU 46, the PCU 47, and an oil cooler 45. One end of the first channel 11 is connected to an inlet 41*i* of a low-temperature radiator 41, and another end thereof is connected to an outlet 41*o* of the low-temperature radiator 41. A pump 48 is disposed on the first channel 11. The pump 48 pumps the first heat medium in the first channel 11. The first heat medium flows from the pump 48 through the oil cooler 45, the low-temperature radiator 41, the SPU 46, and the PCU 47 in this order.

An SPU cooler 46*c* is disposed in the SPU 46. A PCU cooler 47*c* is disposed in the PCU 47. The SPU cooler 46*c* and the PCU cooler 47*c* are connected to the first channel 11. The first heat medium flows through the SPU cooler 46*c* and the PCU cooler 47*c* to cool the SPU 46 and the PCU 47.

An oil circulation path 18 is connected to the oil cooler 45. The oil circulation path 18 extends inside a transaxle 43. The transaxle 43 houses the motor 55. A part of the oil circulation path 18 extends through a sliding portion (i.e., a bearing portion) of the motor 55. In other words, oil in the oil circulation path 18 also functions as lubricating oil in the motor 55. An oil pump 44 is disposed on the oil circulation path 18. The oil pump 44 circulates the oil in the oil circulation path 18. The oil that has cooled the motor 55 is cooled by the first heat medium in the oil cooler 45.

The first heat medium that has cooled the SPU 46, the PCU 47, and the motor 55 (the oil in the oil cooler 45) flows through the low-temperature radiator 41. The heat of the first heat medium is released to the outside air in the low-temperature radiator 41. The low-temperature radiator 41 exchanges heat between the first heat medium and the outside air.

The bypass channel 13 is connected to the first channel 11. One end of the bypass channel 13 is connected to an upstream part of the first channel 11 via a three-way valve 42, and another end thereof is connected to a downstream part of the first channel 11.

The first channel 11 is brought into fluid communication with one of the low-temperature radiator 41 and the bypass channel 13 by the three-way valve 42. The three-way valve 42 is switchable between a first valve position and a second valve position. At the first valve position, the three-way valve 42 allows a flow of the first heat medium from the first channel 11 to the low temperature radiator 41 and cuts off the flow of the first heat medium from the first channel 11 to the bypass channel 13. At the second valve position, the three-way valve 42 allows the flow of the first heat medium from the first channel 11 to the bypass channel 13 and cuts off the flow of the first heat medium from the first channel 11 to the low-temperature radiator 41. When the pump 48 is activated with the three-way valve 42 allowing the flow of the first heat medium from the first channel 11 to the low-temperature radiator 41 (i.e., with the three-way valve 42 at the first valve position), the first heat medium circulates through the SPU 46, the PCU 47, the oil cooler 45, and the low-temperature radiator 41. The heat of the SPU 46, the PCU 47, and the motor 55 (the oil) is released to the outside air via the first heat medium.

When the pump 48 is activated with the three-way valve 42 allowing the flow of the first heat medium from the first channel 11 to the bypass channel 13 (i.e., with the three-way valve 42 at the second valve position), the first heat medium bypasses the low-temperature radiator 41 and circulates through the SPU 46, the PCU 47, and the oil cooler 45. The temperature of the first heat medium rises due to the heat of the SPU 46, the PCU 47, and the motor 55 (the oil). The three-way valve 42 is controlled by a controller 80. Control over the three-way valve 42 will be described later.

The second channel 12 extends through a chiller 52. One end of the second channel 12 is connected to the inlet 41i of the low-temperature radiator 41, and another end thereof is connected to the outlet 41o of the low-temperature radiator 41. The low-temperature radiator 41 is shared between the first channel 11 and the second channel 12. A pump 53 is disposed on the second channel 12. The pump 53 pumps the first heat medium in the second channel 12. A circulation path 22 of the second heat circuit 20 extends through the chiller 52. The chiller 52 transfers the heat of the first heat medium to the second heat medium. In other words, the chiller 52 exchanges heat between the first heat medium and the second heat medium. A role of the chiller 52 will be described later.

The battery channel 14 is connected to the second channel 12. The battery channel 14 extends through the battery 51. One end of the battery channel 14 is connected to the second channel 12 via a three-way valve 49 at a position downstream of the chiller 52. Another end of the battery channel 14 is connected to the second channel 12 at a position upstream of the pump 53.

The chiller 52 is brought into fluid communication with one of the low-temperature radiator 41 and the battery channel 14 by the three-way valve 49. The three-way valve 49 is switchable between a first valve position and a second valve position. At the first valve position, the three-way valve 49 allows the flow of the first heat medium from the chiller 52 to the battery channel 14 and cuts off the flow of the first heat medium from the chiller 52 to the low-temperature radiator 41. At the second valve position, the three-way valve 49 allows the flow of the first heat medium from the chiller 52 to the low-temperature radiator 41 and cuts off the flow of the first heat medium from the chiller 52 to the battery channel 14. When the pump 53 is activated with the three-way valve 49 allowing the flow of the first heat medium from the chiller 52 to the battery channel 14 (i.e., with the three-way valve 49 at the first valve position), the first heat medium circulates between the chiller 52 and the battery 51. The first heat medium cools the battery 51, and then the first heat medium with high temperature is cooled by the second heat medium in the chiller 52. When the pump 53 is activated with the three-way valve 49 allowing the flow of the first heat medium from the chiller 52 to the low-temperature radiator 41 (i.e., with the three-way valve 49 at the second valve position), the first heat medium flows through the second channel 12 and circulates between the chiller 52 and the low-temperature radiator 41. The first heat medium circulates between the chiller 52 and the low-temperature radiator 41 in a heat pump mode. The heat pump mode will be described later.

A heater 50 is disposed upstream of the battery 51 on the battery channel 14. When the temperature of the battery 51 decreases due to cold climates and/or the like, the first heat medium is heated by the heater 50, and then the heated first heat medium heats the battery 51.

As described above, the second heat circuit 20 and the third heat circuit 30 regulate the temperature of the cabin. The second heat circuit 20 is used mainly to cool the air in the cabin. The second heat circuit 20 includes the circulation path 22, an evaporator 63, a compressor 66, an evaporator pressure regulator (EPR) 62, a condenser 67, and a modulator 68.

A three-way valve 65 is disposed on the circulation path 22. The three-way valve 65 switchable between a first valve position and a second valve position. At the first valve position, the three-way valve 65 allows a flow of the second heat medium from the condenser 67 to the evaporator 63. At the second valve position, the three-way valve 65 allows the flow of the second heat medium from the condenser 67 to the chiller 52.

The three-way valve 65 selects the first valve position to cool the cabin. The second heat medium is compressed in the compressor 66 and turns into a high-temperature gas. This second heat medium is cooled in the condenser 67 and thereby turns into a liquid. Only the second heat medium that is in form of liquid in the modulator 68 flows to the three-way valve 65. The liquid second heat medium flows through an expansion valve 64 and the evaporator 63, as a result of which the second heat medium is evaporated and its temperature sharply decreases. The second heat medium with the low temperature cools the air in the cabin. The second heat medium passes through the EPR 62 and is then compressed again in the compressor 66.

In the heat pump mode, the three-way valve 65 is switched to the second valve position to allow the flow of the second heat medium from the condenser 67 to the chiller 52. The heat pump mode is selected when the air in the cabin is to be heated, which will be described later in detail. The second heat medium is compressed in the compressor 66 and turns into a high-temperature gas. In the heat pump mode, this second heat medium releases the heat to the third heat medium in the condenser 67 and turns into a liquid. Only the second heat medium that is in form of liquid in the modulator 68 flows to the three-way valve 65. The liquid second heat medium flows through an expansion valve 61 and the chiller 52, as a result of which the second heat medium is evaporated and its temperature sharply decreases. The second heat medium with low temperature absorbs heat from the first heat medium passing through the chiller 52, as a result of which the temperature of the second heat medium is increased. This second heat medium is compressed in the compressor 66, thus its temperature is increased further. This second heat medium releases the heat to the third heat medium in the condenser 67.

The third heat circuit 30 is used mainly to warm the air in the cabin. The third heat circuit 30 includes a circulation path 32, an electric heater 71, a heater core 74, a pump 72, a high-temperature radiator 75, and a three-way valve 73. The air in the cabin is warmed by high-temperature third heat medium flowing in the heater core 74.

When the air in the cabin is to be warmed, the condenser 67, the electric heater 71, and the heater core 74 are brought into fluid communication with each other by the three-way valve 73. As described above, in the heat pump mode, the third heat medium is heated by the high-temperature second heat medium in the condenser 67. When the heated third heat medium passes through the heater core 74, it warms the air in the cabin. When the heat of the third heat medium is insufficient, the electric heater 71 heats the third heat medium.

When the heat management system 100 has excess heat, the three-way valve 73 allows the flow of the third heat medium from the condenser 67 to the high-temperature radiator 75. The heat transferred from the second heat medium to the third heat medium via the condenser 67 is released to the outside air in the high-temperature radiator 75.

When a cabin air heating mode is selected in the heat management system 100, the air in the cabin is warmed by the third heat medium passing through the heater core 74, as described above. In the cabin air heating mode, the heat of the outside air or the heat of the battery 51 is also utilized. The first heat medium in the first heat circuit 10 is heated by the heat of the outside air or the heat of the battery 51. In the chiller 52, the second heat medium is heated by the heated first heat medium. After passing through the chiller 52, the heated second heat medium is compressed in the compressor 66 and its temperature is thereby increased further. This second heat medium heats the third heat medium in the condenser 67. The third heat medium warms the air in the cabin in the heater core 74. A case of utilizing the heat of the outside air will be termed the heat pump mode.

The heat pump mode will be described. In the heat pump mode, the first heat medium is heated by the heat of the outside air in the low-temperature radiator 41, and then the heated first heat medium heats the second heat medium in the chiller 52. How the heat of the second heat medium warms the air in the cabin is as described above. In disclosure herein, how the heat of the outside air is transferred to the second heat medium for air conditioning in the cabin will be described. The heat pump mode is executed when the temperature of the first heat medium cooled in the chiller 52 is lower than the temperature of the outside air.

Figure 2:
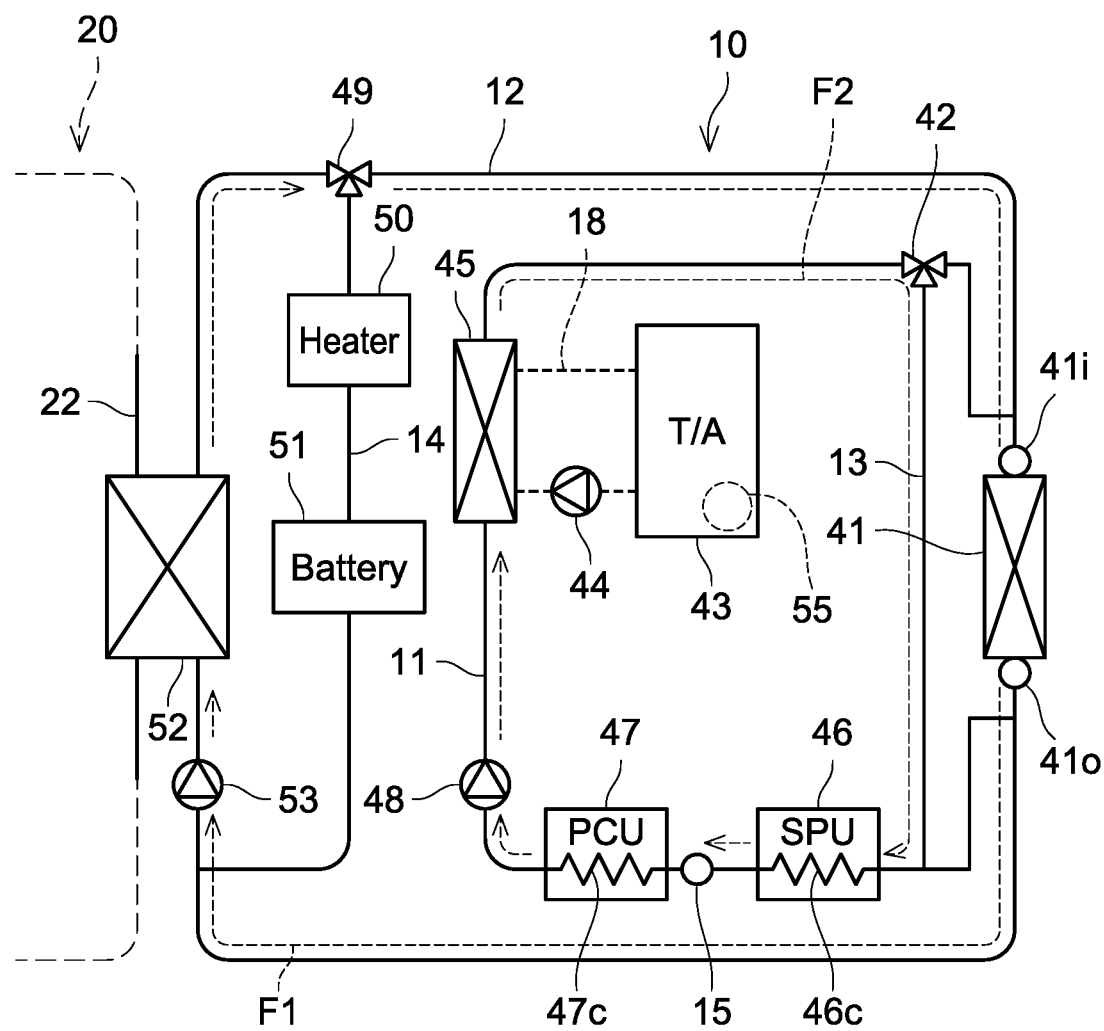
FIG. 2 is a circuit diagram showing a flow of first heat medium at a second valve position.

The heat pump mode is executed by the controller 80. When the heat pump mode is selected, the controller 80 basically holds the three-way valves 42 and 49 at their second valve positions. How the first heat medium flows at this time is shown in FIG. 2. FIG. 2 shows a part of the circulation path 22 of the second heat circuit 20, but does not show the other elements of the second heat circuit 20 nor the third heat circuit 30.

In the heat pump mode, the controller 80 controls the three-way valves 42, 49 synchronously. In the heat pump mode, the controller 80 basically holds both of the three-way valves 42 and 49 at the second positions.

In the heat pump mode, the controller 80 basically holds the three-way valves 42, 49 at the second valve positions to allow the flow of the first heat medium from the second channel 12 to the low-temperature radiator 41 and cut off the flow of the first heat medium from the first channel 11 to the low-temperature radiator 41. As shown by a dashed arrow F1 in FIG. 2, the first heat medium circulates between the chiller 52 and the low-temperature radiator 41. At this time, the first heat medium in the first channel 11 bypasses the low-temperature radiator 41 and circulates through the SPU 46, the PCU 47, and the oil cooler 45.

Firstly, the first heat medium flowing in the second channel 12 will be described. The first heat medium that has been cooled in the chiller 52 flows into the low-temperature radiator 41. While passing through the low-temperature radiator 41, the first heat medium is heated by the outside air. The first heat medium that has been heated by the outside air heats the second heat medium in the chiller 52. As described above, the air in the cabin is warmed by the heat of the second heat medium. In other words, in the heat pump mode, the heat of the outside air is utilized to warm the air in the cabin. The temperature of the first heat medium decreases in the chiller 52. The first heat medium with the decreased temperature returns to the low-temperature radiator 41 and absorbs heat from the outside air again.

In the heat pump mode, as shown by a dashed arrow F2 in FIG. 2, the first heat medium in the first channel 11 does not pass through the low-temperature radiator 41. The temperature of the first heat medium flowing in the first channel 11 keeps rising. If the temperature of the first heat medium flowing in the first channel 11 becomes excessively high, the first heat medium cannot cool the SPU 46, the PCU 47, nor the motor 55. A temperature sensor 15 is disposed in the first heat circuit 10 between the SPU 46 and the PCU 47, and the controller 80 monitors the temperature of the first heat medium that has passed through the SPU cooler 46c. The controller 80 switches the three-way valves 42, 49 to their first valve positions in response to the temperature of the first heat medium that has passed through the SPU 46 (a measurement of the temperature sensor 15) becoming higher than an upper limit temperature.

Figure 3:
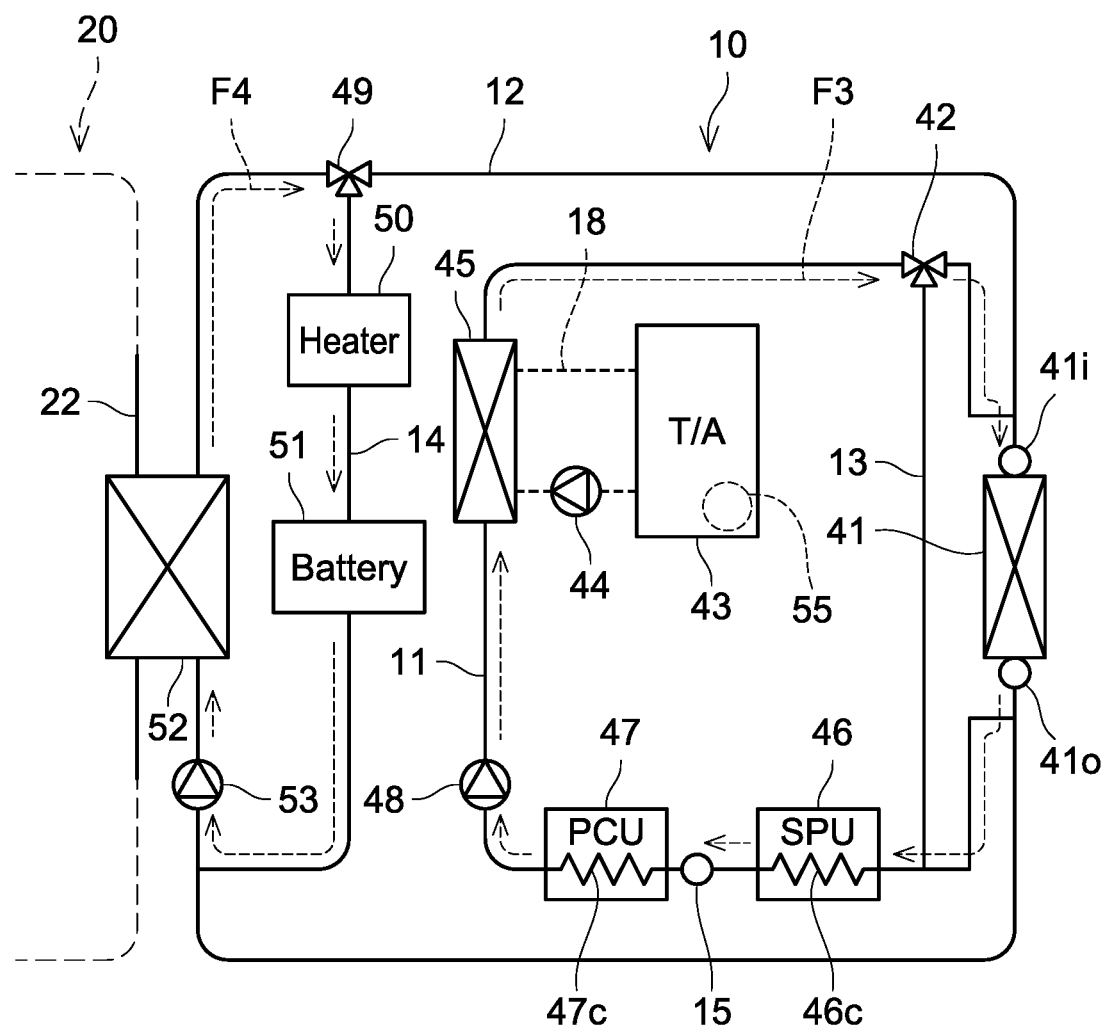
FIG. 3 is a circuit diagram showing a flow of the first heat medium at a first valve position.

FIG. 3 shows how the first heat medium flows after the three-way valves 42, 49 are switched to the first valve positions. When the three-way valves 42, 49 are switched to the first valve positions, the first heat medium is allowed to flow from the first channel 11 to the low-temperature radiator 41 and the first heat medium is stopped from flowing from the second channel 12 to low-temperature radiator 41. The controller 80 keeps activating the pump 48. Consequently, as shown by a dashed arrow F3 in FIG. 3, the first heat medium whose temperature has become higher than the upper limit temperature in the first channel 11 flows into the low-temperature radiator 41. When flowing into the low-temperature radiator 41, the first heat medium is at a temperature higher than the temperature of the outside air. Thus, the first heat medium passing through the low-temperature radiator 41 releases the heat to the outside air. The SPU 46 and the PCU 47 are cooled by the first heat medium of which temperature has decreased by releasing the heat to the outside air.

When switching the three-way valve 42 on the first channel 11 to the first valve position, the controller 80 also switches the three-way valve 49 on the second channel 12 to the first valve position. When the three-way valve 49 is switched to the first valve position, the flow of the first heat medium from the chiller 52 to the low-temperature radiator 41 is cut off. In other words, the flow of the first heat medium from the second channel 12 to the low-temperature radiator 41 is cut off. As described above, in the heat pump mode, the temperature of the first heat medium flowing in the second channel 12 is lower than the temperature of the outside air, and the temperature of the first heat medium flowing in the first channel 11 is higher than the temperature of the outside air. If the first heat medium flowing in the first channel 11 merges with the first heat medium flowing in the second channel 12, the temperature of the first heat medium flowing in the second channel 12 rises. The controller 80 cuts off the flow of the first heat medium from the second channel 12 to the low-temperature radiator 41 while the first heat medium is allowed to flow from the first channel 11 to the low-temperature radiator 41 for heat exchange between the low-temperature radiator 41 and the first heat medium whose temperature is higher than the temperature of the outside air. This prevents the first heat medium flowing in the first channel 11 from merging with the first heat medium flowing in the second channel 12.

When the three-way valves 42, 49 are switched to the first valve positions, the flow of the first heat medium from the chiller 52 to the low-temperature radiator 41 is cut off. The first heat medium that has passed through the chiller 52 does not pass through the low-temperature radiator 41. For a time period while the three-way valve 42 is held at the first valve position, the utilizing the heat of the outside air by the heat pump mode is suspended.

In the heat pump mode, the controller 80 switches the three-way valves 42, 49 to the first valve positions and activates the oil pump 44. By the oil pump 44 being activated, the heat of the motor 55 is transferred to the first heat medium via the oil. The first heat medium that has absorbed the heat of the SPU 46 and the PCU 47 and the heat of the motor 55 flows into the low-temperature radiator 41 and releases the heat.

The controller 80 activates the oil pump 44 in response to the temperature of the oil becoming higher than a predetermined upper limit temperature. In the heat pump mode, however, the controller 80 switches the three-way valve 42 to the first valve position and activates the oil pump 44 even if the temperature of the oil does not reach the upper limit temperature. Such control enables the heat of the motor 55 to be released in the low-temperature radiator 41.

Figure 4:
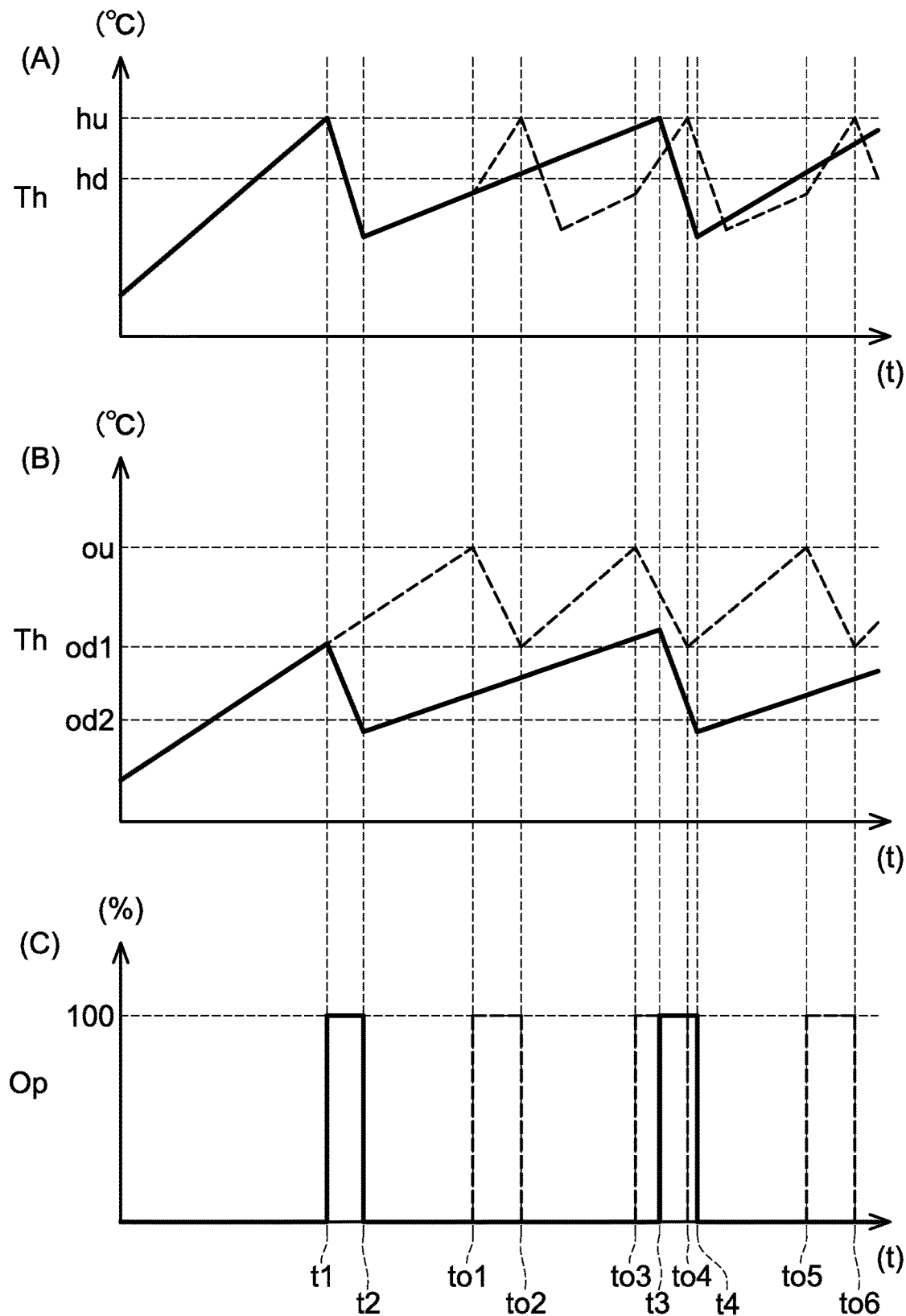
FIG. 4 is timing charts showing changes in values in a heat management system according to a first embodiment.

With reference to FIG. 4, advantages obtained by switching the three-way valve 42 to the first valve position and activating the oil pump 44 in the heat pump mode will be described.

Timing chart (A) in FIG. 4 shows changes in the temperature of the first heat medium measured by the temperature sensor 15 (see FIG. 1). Timing chart (B) in FIG. 4 shows changes in the temperature of the oil circulating in the oil circulation path 18. Timing chart (C) in FIG. 4 shows on and off timings of the oil pump 44. In timing charts (A) to (C), changes during the heat pump mode are depicted by solid lines, while changes during times other than the heat pump mode are depicted by dashed lines.

As described with reference to FIG. 2, the controller 80 basically holds the three-way valves 42, 49 at the second valve positions in the heat pump mode. Due to heat generation of the SPU 46, the PCU 47, and the motor 55, the temperature of the first heat medium in the first channel 11 gradually rises as shown in timing chart (A). When the temperature of the first heat medium becomes higher than an upper limit temperature hu (at time t1), the controller 80 switches the three-way valves 42, 49 from the second valve positions to the first valve positions. As a result, the first heat medium is allowed to flow from the first channel 11 to the low-temperature radiator 41, that is, the first heat medium that has absorbed heat from the SPU 46 and the like flows into the low-temperature radiator 41. Since the first heat medium in the first channel 11 is cooled in the low-temperature radiator 41, the temperature of the first heat medium gradually decreases. At this time, the flow of the first heat medium from the second channel 12 to the low-temperature radiator 41 is cut off, and the utilizing the heat of the outside air by the heat pump mode is suspended.

As shown in timing chart (B), the temperature of the oil gradually rises by the motor 55 being activated. Firstly, how the temperature of the oil changes during times other than the heat pump mode will be described. The controller 80 switches the three-way valves 42, 49 to the first valve positions in response to the temperature of the first heat medium becoming higher than the upper limit temperature hu (at time W. After time t1, the temperature of the first heat medium decreases.

A coil is a main source of the heat of the motor 55, and switching elements are main sources of the heat of the SPU 46 and the PCU 47. A heat capacity of the motor 55 is higher than those of the switching elements in the SPU 46 and the PCU 47. Since the motor 55 has the high heat capacity, the temperature of the oil gently rises. Unless the temperature of the oil is higher than an upper limit temperature ou of an appropriate temperature range at time t1, the controller 80 does not activate the oil pump 44. Consequently, as shown by the dashed line in timing chart (B), the temperature of the oil keeps rising even after time t1.

At time t2, the controller 80 returns the three-way valves 42, 49 to the second valve positions from the first valve positions. The flow of the first heat medium from the first channel 11 to the low-temperature radiator 41 is thereby cut off. The temperature of the first heat medium in the first channel 11 rises again. Meanwhile, after time t2, the first heat medium is allowed to flow from the second channel 12 to the low-temperature radiator 41 again and the heat pump mode restarts.

At time to1, the temperature of the oil becomes higher than the upper limit temperature ou. Since the temperature of the oil becomes higher than the upper limit temperature ou, the controller 80 activates the oil pump 44 (see timing chart (C)). Consequently, the oil is cooled by the first heat medium, and the temperature of the oil decreases. The controller 80 inactivates the oil pump 44 in response to the temperature of the oil becoming lower than a first lower limit temperature od1 (at time to2) (see timing chart (C)). Consequently, heat exchange in the oil cooler 45 between the oil and the first heat medium terminates, and the temperature of the oil gradually rises again. The controller 80 activates the oil pump 44 every time the temperature of the oil becomes higher than the upper limit temperature ou (at times to3, to5). The controller 80 inactivates the oil pump 44 every time the temperature of the oil becomes lower than the first lower limit temperature od1 (at times to4, to6).

While the oil pump 44 is activated, the heat of the oil is transferred to the first heat medium, and thus the temperature of the first heat medium rises (times to1 to to2, times to3 to to4, and times to5 to to6).

The temperature of the first heat medium reaches the upper limit temperature hu at times t1, to2, to4, and to6. Every time the temperature of the first heat medium reaches the upper limit temperature hu, the controller 80 switches the three-way valves 42, 49 from the second valve positions to the first valve positions. That is, the three-way valves 42, 49 are switched frequently. Every time the three-way valves 42, 49 are switched to the first valve positions, the utilizing the heat of the outside air by the heat pump mode is suspended. If the heat pump mode is frequently suspended in the cabin air heating mode, the controller 80 activates the electric heater 71 (see FIG. 1) to supplement shortage of heat. The electric heater 71 consumes electric power to generate heat.

The above-described phenomenon is caused by a fact that the temperature of the oil rises later than the time at which the SPU 46 and the PCU 47 generate heat due to the difference in heat capacity between the PCU 47 (the SPU 46) and the motor 55. In the heat management system 100 according to the embodiment, the controller 80 controls the oil pump 44 such that the three-way valves 42, 49 are switched to the first valve positions less frequently in the heat pump mode.

Next, control by the controller 80 in the heat pump mode according to the present embodiment will be described.

In the heat pump mode, the controller 80 according to the embodiment switches the three-way valves 42, 49 from the second valve positions to the first valve positions, and at the same time, activates the oil pump 44. In the heat pump mode, in response to the temperature of the first heat medium becoming higher than the upper limit temperature hu (at time t1), the controller 80 activates the oil pump 44 in synchronization with the switching of the three-way valves 42, 49 to the first valve positions. Consequently, the heat of the oil (heat of the motor 55) is transferred to the first heat medium via the oil cooler 45. The first heat medium that has absorbed the heat of the SPU 46 and the PCU 47 and the heat of the oil (heat of the motor 55) flows into the low-temperature radiator 41, and the heat is released to the outside air. The heat of the oil (heat of the motor 55) is also simultaneously released to the outside air via the first heat medium.

The controller 80 inactivates the oil pump 44 and switches both of the three-way valves 42, 49 to the second valve positions in response to the temperature of the oil becoming lower than a second lower limit temperature od2 (at time t2). Thereafter, every time the temperature of the first heat medium becomes higher than the upper limit temperature hu, the controller 80 switches the three-way valves 42, 49 to the first valve positions and activates the oil pump 44 (at time t3). The controller 80 inactivates the oil pump 44 and switches both of the three-way valves 42, 49 to the second valve positions every time the temperature of the oil becomes lower than the second lower limit temperature od2 (at time t4). In response to the three-way valves 42, 49 being switched to the second valve positions, the utilizing the heat of the outside air by the heat pump mode is restarted and the heat of the outside air is utilized to heat the air in the cabin.

As described above, in the heat pump mode, the controller 80 switches the three-way valves 42, 49 from the second valve positions to the first valve positions and activates the oil pump 44. Such control decreases the frequency of the three-way valves 42, 49 being switched. The outside air can be utilized efficiently to heat the air in the cabin.

When the cabin air heating mode is selected, the temperature of the outside air may be low. If the temperature of the outside air is low and the first heat medium of which temperature is lower than the temperature of the outside air flows through the low-temperature radiator 41, frost may form. Heat exchange efficiency of the low-temperature radiator 41 is decreased by frost forming on the low-temperature radiator 41. Use efficiency of the heat of the outside air to heat the air in the cabin is thereby decreased. The decrease in heat exchange efficiency caused by frost formation is detected as a temperature difference of the first heat medium between at the inlet 41*i* and at the outlet 41*o* of the low-temperature radiator 41. In addition to the above-described control, the controller 80 may switch both of the three-way valves 42, 49 to the first valve positions and activate the oil pump 44 in response to the temperature difference of the first heat medium between at the inlet 41*i* and at the outlet 41*o* of the low-temperature radiator 41 becoming smaller than a predetermined temperature difference threshold. This allows the heat of the oil to be utilized to melt the frost on the low-temperature radiator 41.

(Second Embodiment) A heat management system 100 according to a second embodiment will be described. The heat management system 100 according to the second embodiment is the same as the heat management system 100 according to the first embodiment (FIG. 1) in the structure, but is different therefrom in the control executed by the controller 80.

While executing the heat pump mode, the controller 80 periodically switches the three-way valves 42, 49 to avoid frost formation on the low-temperature radiator 41. While executing the heat pump mode, the controller 80 switches the three-way valves 42, 49 from the second valve positions to the first valve positions and activates the oil pump 44 periodically. The controller 80 returns the three-way valves 42, 49 to the second valve positions from the first valve positions and inactivates the oil pump 44 in response to a predetermined time having passed. Frost formation can be prevented by periodically delivering the first heat medium that has received heat from the oil to the low-temperature radiator 41.

Before switching the three-way valves 42, 49 to the first valve positions, the controller 80 activates the oil pump 44 if the temperature of the oil is higher than the temperature of the first heat medium, to increase the temperature of the first heat medium by the heat of the oil. When the three-way valves 42, 49 are switched to the first valve positions, the heated first heat medium flows through the low-temperature radiator 41. A higher defrosting effect can be expected.

Figure 5:
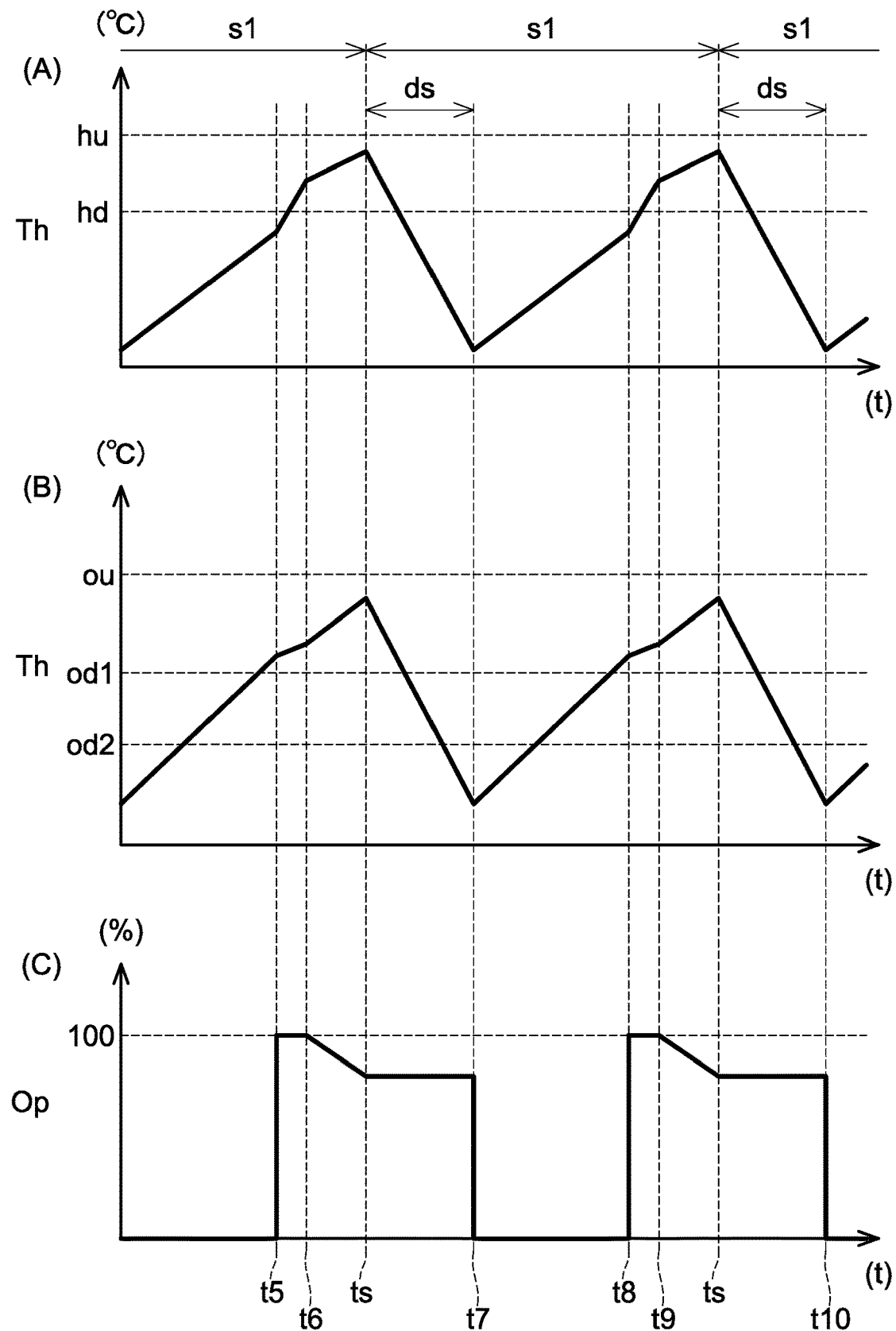
FIG. 5 is timing charts showing changes in values in a heat management system according to a second embodiment.

With reference to FIG. 5, an example of process executed by the controller 80 will be described specifically. Timing chart (A) in FIG. 5 shows changes in the temperature of the first heat medium measured by the temperature sensor 15 (see FIG. 1). Timing chart (B) in FIG. 5 shows changes in the temperature of the oil circulating in the oil circulation path 18. Timing chart (C) in FIG. 5 shows changes in the output of the oil pump 44. Timing chart (C) in FIG. 5 shows the output of the oil pump 44 in percentage.

While executing the heat pump mode, the controller 80 basically holds both of the three-way valves 42, 49 at the second valve positions to heat the air in the cabin by utilizing the heat of the outside air. The controller 80 switches both of the three-way valves 42, 49 to the first valve positions on a cycle s1 and returns both of the three-way valves 42, 49 to the second valve positions in response to a predetermined time ds having passed.

As described with reference to FIG. 2, in the heat pump mode, the controller 80 basically holds the three-way valves 42, 49 at the second valve positions. As shown in timing chart (A) in FIG. 5, the temperature of the first heat medium in the first channel 11 gradually rises due to the heat of the SPU 46 and the PCU 47. The motor 55 also generates heat, thus the temperature of the oil rises. At time t5 in FIG. 5, the temperature of the oil becomes higher than the temperature of the first heat medium. In response to the temperature of the oil becoming higher than the first heat medium, the controller 80 activates the oil pump 44. Heat is thereby transferred from the oil to the first heat medium in the oil cooler 45. At this time (after time t5), as shown in timing chart (C) in FIG. 5, the controller 80 sets an output Op of the oil pump 44 to its maximum (100%). Consequently, as shown between time t5 and time t6 in timing chart (A) in FIG. 5, the temperature of the first heat medium sharply rises. On the other hand, as shown between time t5 and time t6 in timing chart (B) in FIG. 5, the rise rate of the temperature of the oil is low.

The controller 80 of the heat management system 100 according to the second embodiment activates the oil pump 44 before switching the three-way valves 42, 49 to the first valve positions to heat the first heat medium by the heat of the oil. When the controller 80 switches the three-way valves 42, 49 to the first valve positions, the first heat medium that has absorbed the heat of the oil flows through the low-temperature radiator 41. The heat management system 100 according to the second embodiment can defrost the low-temperature radiator 41 by further utilizing the heat of the oil. Simultaneously, the heat of the oil is released to the outside air.

As shown in timing chart (C) in FIG. 5, the controller 80 gradually decreases the output of the oil pump 44 from time t6. Consequently, the flow rate of the oil in the oil circulation path 18 decreases. The amount of heat transferred from the oil to the first heat medium in the oil cooler 45 decreases. As shown in timing chart (B) in FIG. 5, the rise rate of the temperature of the oil thus increases again from time t6. On the other hand, since the amount of heat the first heat medium absorbs from the oil decreases after time t6, the rise rate of the temperature of the first heat medium is lower than that from time t5 to time t6. Consequently, it takes longer for the temperature of the first heat medium to become higher than the upper limit temperature hu. In the example of FIG. 5, the temperature of the first heat medium does not reach the upper limit temperature hu even after the cycle s1 has passed. The controller 80 is configured to switch the three-way valves 42, 49 to the first valve positions, regardless of the cycle s1, in response to the temperature of the first heat medium becoming higher than the upper limit temperature hu to allow the heat of the first heat medium to be released in the low-temperature radiator 41. Since the rise rate of the temperature of the first heat medium decreases by the output of the oil pump 44 being gradually decreased, the three-way valves 42, 49 do not have to be switched in the midst of the cycle s1. In other words, the frequency of the three-way valves 42, 49 being switched is not increased.

In a case where cooling of the oil should be prioritized, such as when the temperature of the oil is higher than the upper limit temperature ou and/or when the temperature of the motor 55 is higher than a threshold temperature, the controller 80 may not decrease the output of the oil pump 44.

When the cycle s1 has passed (at time ts), the controller 80 switches the three-way valves 42, 49 to the first valve positions. By the three-way valves 42, 49 being switched, the first heat medium in the first channel 11 flows into the low-temperature radiator 41 and the heat of the first heat medium is released to the outside air. Consequently, as shown in timing chart (A) in FIG. 5, the temperature of the first heat medium decreases after time ts. Since the temperature of the first heat medium decreases, the temperature of the oil also decreases as shown in timing chart (B) in FIG. 5. Thereafter, in response to the predetermined time ds having passed (at time t7), the controller 80 returns the three-way valves 42, 49 to the second valve positions and inactivates the oil pump 44. After time t7, the temperature of the first heat medium in the first channel 11 and the temperature of the oil rise again. The controller 80 switches the three-way valves 42, 49 from the second valve positions to the first valve positions on the cycle s1.

At time t8, the temperature of the oil becomes higher than the temperature of the first heat medium again. The process from time t5 to time t7 is repeated from time t8 to time t10. The first heat medium in the first channel 11 repeatedly flows through the low-temperature radiator 41 on the cycle s1, and frost formation is thereby prevented.

The controller 80 may inactivate the oil pump 44 in response to the temperature of the oil becoming lower than a second lower limit temperature od2 before the predetermined time ds passes. This prevents the temperature of the oil from decreasing excessively. Moreover, the cycle s1 and the predetermined time ds are varied depending on conditions such as the capacities of the pump 48 and the oil pump 44, set temperatures for the oil and the first heat medium in the first channel 11, etc. For example, when the temperature of the motor 55 is obviously higher than the temperature of the oil, the output of the oil pump 44 may be decreased by shortening the cycle s1, to increase the frequency of switching to the first valve positions.

Points to be noted relating to the technology described in the embodiments will be listed. The SPU 46 and the PCU 47 are examples of "power converter". The SPU cooler 46c and the PCU cooler 47c are examples of "converter cooler". The low-temperature radiator 41 is an example of "first heat exchanger", and the chiller 52 is an example of "second heat exchanger". In the above-described embodiments, the three-way valves 42, 49 configure "channel valve".

Variants of the above-described embodiments will be described below.

(First Variant) The above-described first embodiment describes the control by the controller 80 while the controller 80 executes the heat pump mode. However, the heat management system 100 is not limited to the configuration shown in FIG. 1. For example, the second heat exchanger may be a device configured to transfer heat from the second heat medium to the first heat medium. The controller 80 basically holds the three-way valves 42, 49 at the second valve positions to allow the first heat medium to flow from the second channel 12 to the low-temperature radiator 41, as a result of which the heat of the second heat medium is released in the low-temperature radiator 41 via the first heat medium. The controller 80 switches the three-way valves 42, 49 to the first valve positions and activates the oil pump 44. The first heat medium that has absorbed the heat of the oil is cooled in the low-temperature radiator 41. The heat of the oil is effectively released to the outside air.

(Second Variant) In the first embodiment, the controller 80 determines that frost may form on the low-temperature radiator 41 when the temperature difference of the first heat medium between at the inlet 41i and at the outlet 41o of the low-temperature radiator 41 becomes smaller than the temperature difference threshold. In response to determining that frost may form, the controller 80 switches the three-way valves 42, 49 from the second valve positions to the first valve positions and activates the oil pump 44. In a second variant, the controller 80 may determine that frost may form based on a speed of the outside air passing through the low-temperature radiator 41, for example.

(Third Variant) In the above-described embodiments, the controller 80 inactivates the oil pump 44 in response to the temperature of the oil becoming lower than the second lower limit temperature od2 during the heat pump mode. Alternatively, in a third variant, the controller 80 may inactivate the oil pump 44 in response to the temperature of the first heat medium becoming lower than the first lower limit temperature od1.

(Fourth Variant) In the above-described embodiments, the flow of the first heat medium is controlled by using the two three-way valves 42, 49, but it may be controlled differently. For example, a heat management system 100 that does not include the battery channel 14 may be provided with a stop valve configured to cut off the flow of the first heat medium from the second channel 12 to the low-temperature radiator 41, in place of the three-way valve 49.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:
1. A heat management system for an electric vehicle, comprising:
an oil cooler configured to cool oil by a first heat medium, the oil being used to cool a traction motor;

an oil pump configured to circulate the oil between the oil cooler and the traction motor;

a converter cooler configured to cool a power converter configured to supply electric power to the traction motor by the first heat medium;

a first heat exchanger configured to exchange heat between the first heat medium and outside air;

a second heat exchanger configured to exchange heat between a second heat medium for an air conditioner of a cabin and the first heat medium;

a first channel in which the first heat medium flows, the first channel extending through the oil cooler and the converter cooler and connected to an inlet and an outlet of the first heat exchanger;

a second channel in which the first heat medium flows, the second channel extending through the second heat exchanger and connected to the inlet and the outlet of the first heat exchanger;

a channel valve configured to select a first valve position and a second valve position, wherein at the first valve position, the channel valve allows a flow of the first heat medium from the first channel to the first heat exchanger and cuts off the flow of the first heat medium from the second channel to the first heat exchanger, and at the second valve position, the channel valve allows the flow of the first heat medium from the second channel to the first heat exchanger and cuts off the flow of the first heat medium from the first channel to the first heat exchanger;

a bypass channel configured to allow the first heat medium to bypass the first heat exchanger and circulate between the oil cooler and the converter cooler when the second valve position is selected; and a controller configured to control the channel valve and the oil pump, wherein the controller is configured to:

execute a heat pump mode in which the channel valve selects the second valve position, heat is transferred from the outside air to the first heat medium in the first heat exchanger, and heat is transferred from the first heat medium to the second heat medium in the second heat exchanger;

while executing the heat pump mode, periodically execute an operation of:

switching the channel valve from the second valve position to the first valve position and activating the oil pump; and returning the channel valve from the first valve position to the second valve position and inactivating the oil pump in response to a predetermined time having passed.

2. The heat management system of claim 1, wherein the controller is configured to activate the oil pump in response to a temperature of the oil becoming higher than a temperature of the first heat medium in the first channel while holding the channel valve at the second valve position during the heat pump mode.

3. The heat management system of claim 1, wherein the controller is configured to switch the channel valve from the second valve position to the first valve position and activate the oil pump regardless of a cycle of the operation, in response to a temperature of the first heat medium in the first channel becoming higher than a predetermined upper limit temperature while holding the channel valve at the second valve position during the heat pump mode.

4. The heat management system of claim 1, wherein the controller is configured to decrease an output of the oil pump gradually before the predetermined time passes and inactivate the oil pump in response to the predetermined time having passed.

5. The heat management system of claim 1, wherein the controller is configured to:

inactivate the oil pump in response to a temperature of the oil becoming lower than a first lower limit temperature while not executing the heat pump mode; and inactivate the oil pump in response to the temperature of the oil becoming lower than a second lower limit temperature while executing the heat pump mode, the second lower limit temperature being lower than the first lower limit temperature.

* * * * *